United States Patent [19]

Ikeda

[11] 4,451,906

[45] May 29, 1984

[54] DYNAMIC TYPE MEMORY DEVICE HAVING IMPROVED OPERATION SPEED

[75] Inventor: Hiroaki Ikeda, Tokyo, Japan

[73] Assignee: Nippon Electric Co., Ltd., Tokyo, Japan

[21] Appl. No.: 303,321

[22] Filed: Sep. 17, 1981

[30] Foreign Application Priority Data

Sep. 18, 1980 [JP] Japan .................. 55-129497

[51] Int. Cl.³ ........................................... G11C 7/00
[52] U.S. Cl. ................................... 365/205; 365/190; 365/207; 365/208; 365/210
[58] Field of Search ............... 365/190, 205, 207, 208, 365/210

[56] References Cited

U.S. PATENT DOCUMENTS 4,069,475  1/1978  Boettcher .......................... 365/205
4,274,013  6/1981  Clemons et al. .................... 365/190

Primary Examiner—George G. Stellar
Attorney, Agent, or Firm—Sughrue, Mion, Zinn, Macpeak & Seas

[57] ABSTRACT

An improved memory device operable at a high-speed is disclosed. The memory device comprises a pair of bit lines, a sense amplifier having a pair of input terminals, a pair of control gates coupled between the pair of bit lines and the pair of input terminals of the sense amplifier, a pair of bus lines, and a pair of transfer gates connecting the input nodes of the sense amplifier to the pair of bus lines without via the control gates.

10 Claims, 9 Drawing Figures

DYNAMIC TYPE MEMORY DEVICE HAVING IMPROVED OPERATION SPEED

BACKGROUND OF THE INVENTION

The present invention relates to a semiconductor memory device formed of semiconductor elements, and more particularly to a dynamic memory device formed of insulated gate field effect transistors.

Dynamic memories making use of insulated gate field effect transistors (IGFET's) have been widely used as a large-capacity memory. The memory capacity of dynamic memory integrated circuits has been increased year by year, and a memory having a memory capacity of 64K bits has been made commercially available. Moreover, an access time of the memory has been shortened and memories having an a access time of 100~200 nS are obtained. Although enlargement of capacity or increase in an integration density and increase of operation speed are not always incompatible in nature, values of stray capacitances and resistances of bit lines associated with a sense amplifier have been increasing in proportion to enlargement of capacity, and, hence, it has been difficult to increase operation speed. Furthermore, since the value of the power supply voltage for a memory device has been shifted from +12 V to +5 V, the differential signal to be sensed by a sense amplifier has been reduced, and, therefore, increasing the operation speed has become more difficult.

As is known, the sense amplifier is required to sense a difference signal appearing on bit lines at a high sensitivity and to quickly amplify this difference signal, and this speed of amplification is determined by the ability of a transistor in a flip-flop forming the sense amplifier, by the capacitance of nodes on which a signal to be amplified is placed and by the time constant possessed by these nodes.

Accordingly, it becomes necessary upon high speed difference signal amplification and thus upon high speed read operations, either to enhance the ability of the transistor forming the sense amplifier or to reduce the capacitance and time constant at the input nodes to the sense amplifier.

However, the method of simply enhancing the ability of transistor forming the sense amplifier would result in increase of the layout area on a semiconductor substrate, and hence this method is unfavorable in view of integration density. Moreover, even if the transistor ability should be enhanced, since the speed of difference signal amplification is still limited by a time constant associated with the bit lines, this method would be a less effective method.

In this respect, a sense amplifier of the type wherein a transfer gate is disposed between a bit line and a sense amplifier and by controlling this transfer gate most of the bit line capacitance is made not to be seen from the sense amplifier during the initial period of the difference signal amplifier, was proposed in U.S. Pat. No. 4,061,999. Namely, since a pair of input modes of this proposed sense amplifier are held at a high impedance state with respect to a pair of digit lines upon commencement of amplification, the load capacitance of the sense amplifier at this moment is small and hence it is possible to sense a difference signal at a high speed. However, a long period has been required to establish a read signal between the digital lines connected to this sense amplifier, and hence, output of a read signal to the exterior has been slow.

Furthermore, in the case where after any information has been read from a given digit line, and where information opposite to the previous read information is written on the same digit line, since discharge and charge of the entire digit line are necessitated, writing at a high speed has been difficult.

In addition, recently 5 V is mainly employed as the power supply voltage for the memory device in place of 12 V, and hence, a quantity of electric charge pertinent to transfer or handling of each information is being reduced. Consequently, it is necessary to effectively transfer or handle internal signals pertinent to read information and write information without reduction in level.

SUMMARY OF THE INVENTION

It is one object of the present invention to provide a semiconductor memory device which can operates at a high speed.

Another object of the present invention is to provide a dynamic memory device having a large memory capacity.

The essence of the present invention exists in that a pair of input nodes of a sense amplifier are connected to a pair of associated bit lines through a pair of control gates respectively which are turned OFF after a difference signal has appeared on the bit lines so that upon amplification of the difference signal the stray capacitance and resistance of the bit lines may not affect the sense amplifier at all and so that interface of information with an input/output bus is effected in the sense amplifier section rather than from the bit lines. Thus amplification of the difference signal is achieved at a high speed, and discharge and charge of the bit lines, which were necessary upon write operations in the prior art, are made unnecessary. Further, a lower potential on the bit lines is established by turning the control gate ON only on the lower potential side of the sense amplifier section after the state of the sense amplifier has been finally determined. At this moment, on the higher potential side of the sense amplifier section, refreshing or writing of information is automatically effected during the period of the read operation.

According to one feature of the present invention, there is provided a memory device including first and second IGFET's having cross-connected drains and gates at first and second nodes, and first and second bit lines, a third IGFET coupled between the first node and the first bit line, a fourth IGFET coupled between the second node and the second bit line, a first input/output line, a second input/output line, a fifth IGFET coupled between the first node and the first input/output line, a sixth IGFET coupled between the second node and the second input/output line, in which, after a difference signal produced between the first and second bit lines is applied to the first and second nodes through the third and fourth IGFET's, the third and fourth IGFET's are turned from ON to OFF and the amplification of the difference signal is effected by the first and second IGFET while the third and fourth transistors are kept OFF. Then, output of information from the first and second nodes to the first and second input/output lines, respectively, are effected via fifth and sixth IGFET's, and at the time point when the potentials at the first and second nodes have been established, the gate voltages of the third and fourth IGFET's are driven so as to turn these IGFET's ON thereby to turn either one of the third and fourth IGFET's ON which is associated to the bit line brought to the lower potential. Thus, the lower potential on the bit line can be refreshed.

According to another feature of the present invention, there is provided the above-featured memory device, in which first and second pull-up circuits are connected respectively to the first and second bit lines, and during a read period, write period or lower potential refresh period, the pull-up circuits are actuated to pull the bit line held at a higher potential up to the drain power supply voltage.

DETAILED DESCRIPTION OF THE PRIOR ART

In the following, description will be made, by way of example, with respect to the case where N-channel MOS transistors are employed as IGFET's and a higher level represents logic "1" while a lower level represents logic "0". However, the circuit structure and the operations are essentially the same in the case where P-channel IGFET's are employed.

Figure 1:
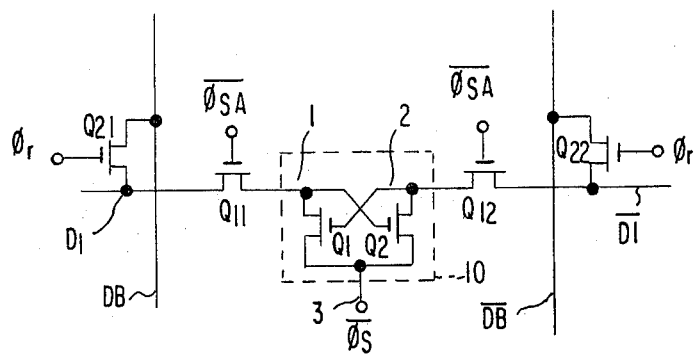
FIG. 1 is a schematic circuit diagram showing a memory device in the prior art.

At first major part of a memory device in the prior art will be explained with reference to FIG. 1. In this figure, a flip-flop section 10, formed of enhancement type MOS transistors $Q_1$ and $Q_2$, performs as a sense amplifier. A signal $\overline{\phi_{SA}}$ is applied to gates of transfer gate transistors $Q_{11}$ and $Q_{12}$ for control. The drain of the transistor $Q_{11}$ is connected to a node 1 of the sense amplifier 10, and its source is connected to a bit line $D_1$. Likewise, the drain of the transistor $Q_{12}$ is connected to a node 2 of the sense amplifier 10, and its source is connected to a bit line $\overline{D_1}$. To a common source node 3 of the sense amplifier 10 is applied a signal $\overline{\phi_S}$.

To the bit lines $D_1$ and $\overline{D_1}$ are connected selection gate transistors $Q_{21}$ and $Q_{22}$, respectively, and transfer of information between input/output buses DB and $\overline{DB}$ and the bit lines $D_1$ and $\overline{D_1}$ is effected. To the gates of the transistors $Q_{21}$ and $Q_{22}$ is applied a bit line selection signal $\phi_r$.

Figure 2:
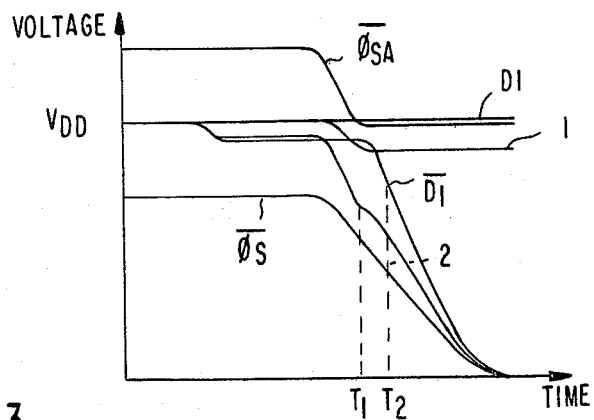
FIGS. 2 and 3 are waveform diagrams showing internal waveforms upon operation of the circuit shown in FIG. 1.

Voltage variations at the respective nodes when this sense amplifier system amplifies a difference signal are illustrated in FIG. 2.

The bit lines $D_1$ and $\overline{D_1}$ are precharged up to the drain power supply level (hereinafter represented by $V_{DD}$) or a level near to $V_{DD}$. At this moment, provision is made such that the signal $\overline{\phi_{SA}}$ may become higher than the power supply voltage $V_{DD}$ and the signal $\overline{\phi_S}$ also may become near to $V_{DD}$. Accordingly, the nodes 1 and 2 are precharged up to the same potential as the bit lines.

After the above-mentioned state has been established, a minute difference signal caused by a selected memory cell is applied between the bit lines $D_1$ and $\overline{D_1}$, and the sense amplifier 10 would amplify this minute difference signal. When a minute difference signal has been applied, the signal $\overline{\phi_{SA}}$ is lowered to the proximity of the precharge level of the bit lines to turn OFF the transistors $Q_{11}$ and $Q_{12}$. At the same time, the signal $\overline{\phi_S}$ is lowered to the source power supply level (hereinafter represented by $V_{SS}$). Then the sense amplifier 10 commences amplification of the difference signal, and since the transistors $Q_{11}$ and $Q_{12}$ are both held OFF at that moment, the object to be subjected to the difference signal amplification is the level difference between the nodes 1 and 2. It is easy to make the stray capacitance and resistance associated with the nodes 1 and 2 extremely small as compared to those associated with the bit lines $D_1$ and $\overline{D_1}$, and therefore, in the initial period of the difference signal amplification, amplification at a high speed becomes feasible. Assuming now that the node 2 is in a slightly lower potential state, then as the signal $\overline{\phi_S}$ falls in potential, the potential at the node 2 would be lowered. As the potential at the node 2 is lowered, the transistor $Q_{12}$ would be turned ON, and hence the potential on the bit line $\overline{D_1}$ would be lowered as the node 2 is lowered in potential.

Upon the above-mentioned amplification of the minute difference signal, it is difficult to achieve the difference signal amplification while maintaining the transistor $Q_1$ completely OFF. Rather, normally the transistor $Q_1$ is turned slightly ON, and so, the potential at the node 1 would be slightly lowered during the difference signal amplification. However, in this instance, the potential fall at the node 1 is not sufficient for turning the transistor $Q_{11}$ ON, and hence the potential on the bit line $D_1$ is maintained approximately at the precharge potential.

Through a series of operations as described above, amplification of the minute difference signal and hence refresh of information are completed. Then on the bit lines $D_1$ and $\overline{D_1}$ is carried the amplified difference signal.

This amplified information established on the bit lines $D_1$ and $\overline{D_1}$ is taken out through the transistors $Q_{21}$ and $Q_{22}$ to the input/output buses DB and $\overline{DB}$ in response to a selection signal.

Even in the case where a sufficiently readable potential difference is present between the nodes 1 and 2, at time $T_1$ when the potential difference between the bit lines $D_1$ and $\overline{D_1}$ is not sufficiently large, it is difficult to readout information on the input/output buses DB and $\overline{DB}$, resulting in a malfunction. Accordingly, it would be required to wait until time $T_2$ when the potential difference between the bit lines $D_1$ and $\overline{D_1}$ becomes sufficiently large. This implies that, although this type of sense amplifier is capable of detecting a difference signal at a high speed to a certain extent, in the case of carrying out very high speed reading, the operation speed is still limited by the stray capacitances and time constants of the bit lines. In other words, if the capacitances and resistances of the bit lines $D_1$ and $\overline{D_1}$ are increased as a result of enlargement of the memory capacity of a memory device, then the access time for reading would become longer.

Figure 3:
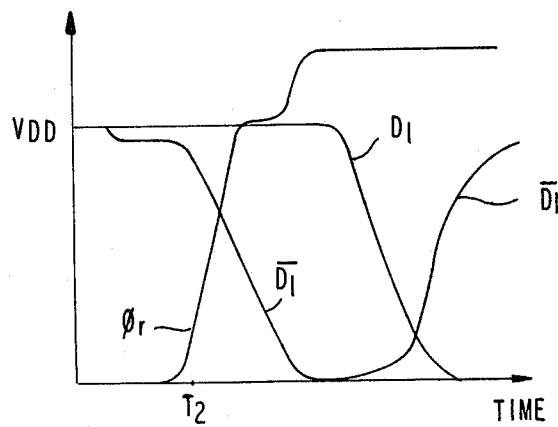

Now, potential variations on the bit lines, in the event that after a read operation has been effected in this sense amplifier system, opposite information is written through the same bit lines, will be described with reference to FIG. 3.

Since opposite information is written after the states of the bit lines and the sense amplifier have been established, the sense amplifier acts in the direction for hindering to write a higher level on the previously lowered bit line. Therefore, unless the bit line $D_1$ and the node 1 held at a higher potential after reading are discharged through the transistor $Q_{21}$, and thus the transistor $Q_2$ is turned OFF, it is difficult to write a higher level on the bit line $\overline{D_1}$ through the transistor $Q_{22}$. In other words, a write operation of opposite information after a read operation necessitates charge and discharge of the entire bit line. This becomes a large hindrance to high speed writing as enlargement of memory capacity proceeds. That is, increase of the capacitance and time constant of the entire bit lines would result in increase of charge and discharge time and thus would cause delay in writing.

Moreover, as the power supply voltage transfers from a +12 V system to a +5 V system, the quantity of electrical charge which can be handled decreases, and so it is required that the quantity of electrical charge upon writing also should be as much as possible. To this end, it is required that write information carried on the input/output buses and the bit lines should be at the $V_{DD}$ level and the bit line selection signal $\phi_r$ should be $V_{DD}$ or higher. This means the possibility of causing complexity and reduction of the reliability of the peripheral circuit of the memory device.

DESCRIPTION OF PREFERRED EMBODIMENTS

Now, preferred embodiments of the present invention will be described with reference to the accompanying drawings.

Figure 4:
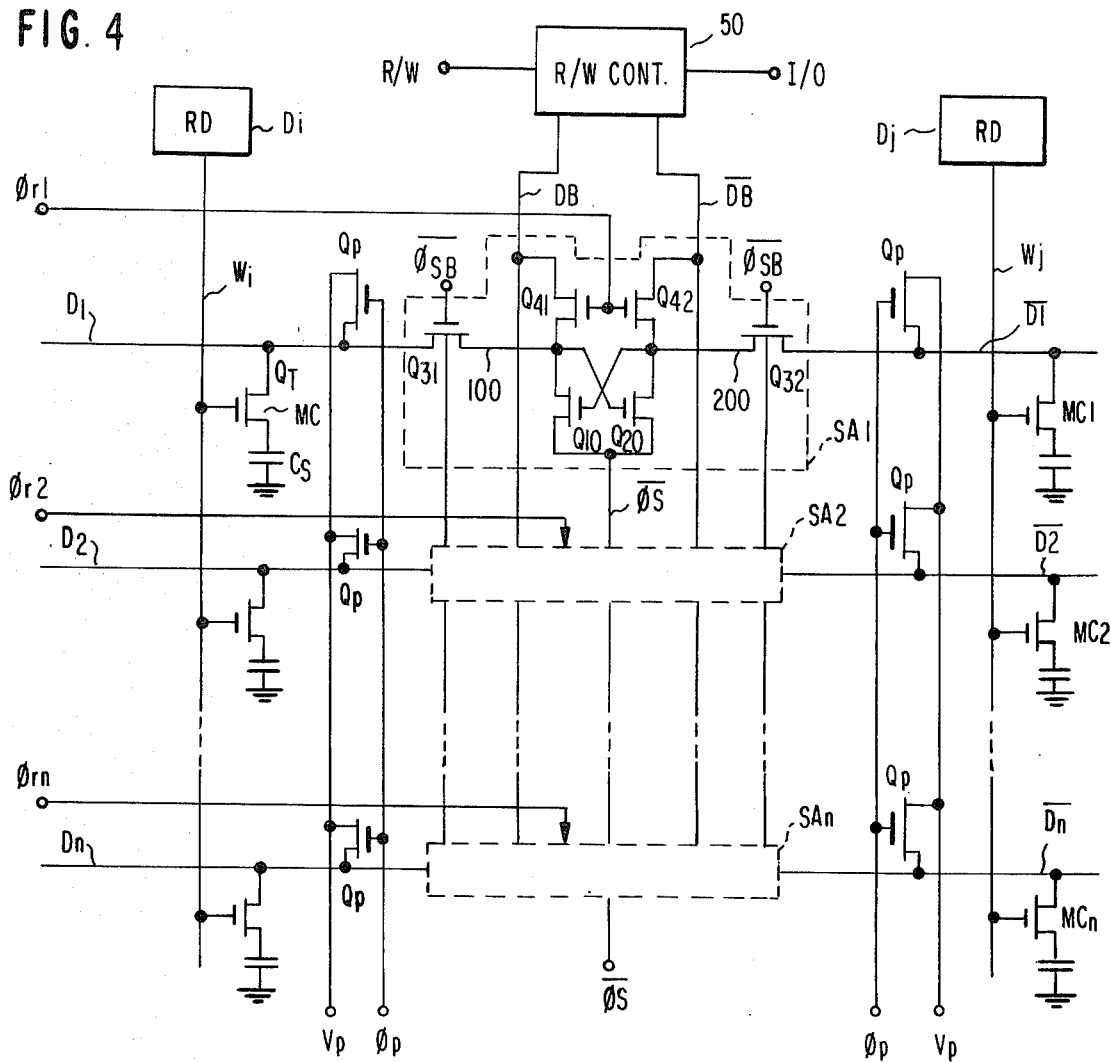
FIG. 4 is a schematic circuit diagram showing one preferred embodiment of a memory device according to the present invention.

A first preferred embodiment of the memory device according to the present invention is illustrated in FIG. 4. In this figure, a plurality of word lines $W_i, W_j, \ldots$ are provided in parallel to each other and extending in the row direction (in the vertical direction in the figure), and a plurality of digit line pairs $(D_1, \overline{D_1}), (D_2, \overline{D_2}) \ldots (D_n, \overline{D_n})$ are provided in parallel to each other and extending in the column direction (in the horizontal direction in the figure). At each cross-point between the word lines and digit lines is disposed a so-called one-transistor type memory cell MC formed of a transfer gate transistor $Q_T$ and a memory capacity $C_S$ as shown in FIG. 4. Sense amplifiers $SA_1, SA_2, \ldots, SA_n$ are aligned in the row (vertical) direction, and the respective corresponding digit line pairs are connected to the inputs of these sense amplifier via MOS transistors $Q_{31}$ and $Q_{32}$ acting as control transistor gates. Precharge transistors $Q_P$ are connected to the respective digit lines and disposed symmetrically with respect to each sense amplifier so as to charge the respective digit lines up to a precharge voltage $V_P$ in response to a precharge signal $\phi_P$.

In the following, description will be made, by way of example, with respect to a sense amplifier $SA_1$. In this sense amplifier, a latch signal $\overline{\phi_S}$ is applied to a common source node 300 of a flip-flop formed of two enhancement type MOS transistors $Q_{10}$ and $Q_{20}$, and the drain of the MOS transistor $Q_{31}$ is connected to a node 100 which is in turn connected to the drain of the transistor $Q_{10}$. The source of the transistor $Q_{31}$ is connected to a bit line $D_1$. To the gate of the transistor $Q_{31}$ is applied a control signal $\overline{\phi_{SB}}$. To the node 100, which is connected to the drain of the transistor $Q_{10}$, is connected the source of a bit line selection MOS transistor $Q_{41}$ for effecting interchange of information with an input/output bus DB; the drain of this transistor $Q_{41}$ is connected to the input/output bus DB, and the gate of the transistor $Q_{41}$ is controlled with a bit line selection signal $\phi_{r1}$. Input/output or read/write control buses DB and $\overline{DB}$ are connected to an input/output circuit 50 in which read and write functions are switched in response to a control signal R/W. Similar connections to those described above are made with respect to a node 200 to which the drain of the transistor $Q_{20}$ is connected, a bit line $\overline{D_1}$, the input/output bus $\overline{DB}$, a control transfer gate MOS transistor $Q_{32}$ and a bit line selection MOS transistor $Q_{42}$.

Figure 5:
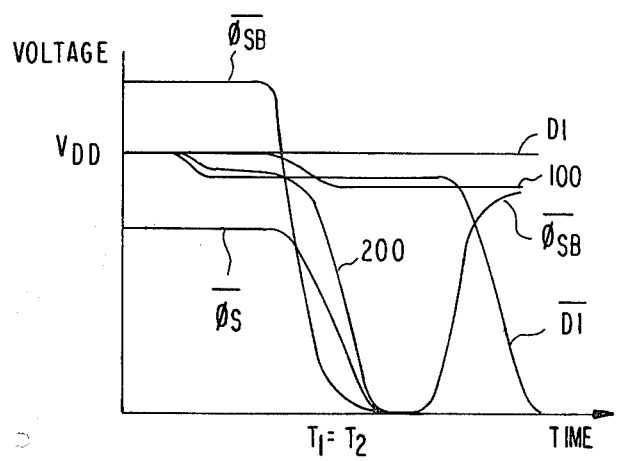
FIGS. 5 and 6 are waveform diagrams showing internal waveforms upon operation of the circuit shown in FIG. 4.

In FIG. 5 are illustrated voltage variations at the respective nodes when the sense amplifier circuit according to the present invention shown in FIG. 4 amplifies a difference signal.

The bit lines $D_1$ and $\overline{D_1}$ are precharged up to the $V_{DD}$ level or a level close to the $V_{DD}$ level. At this moment, provision is made such that the control signal $\overline{\phi_{SB}}$ takes a level equal to or higher than $V_{DD}$, and the latch signal $\overline{\phi_S}$ also takes a level close to $V_{DD}$. Accordingly, the nodes 100 and 200 are precharged up to the same potential as the bit lines $D_1$ and $\overline{D_1}$. After such a state has been established, a small difference signal is applied between the bit lines $D_1$ and $\overline{D_1}$ by selectively energizing a word line, and then this small difference signal is amplified.

After the small difference signal has been applied, the control signal $\overline{\phi_{SB}}$ is lowered to a $V_{SS}$ level (ground potential). Then the control signal $\overline{\phi_{SB}}$ is fixed at the $V_{SS}$ level until read and/or write operations are completed. Thereby, the sense amplifier section $SA_1$ is completely isolated from the bit lines $D_1$ and $\overline{D_1}$ during the read and/or write operations. In other words, the stray capacitances and resistances of the bit lines will not affect the read and write operations at all.

The difference signal appearing on the bit lines is introduced to the nodes 100 and 200 via the transfer gate MOS transistors $Q_{31}$ and $Q_{32}$, and in response to potential fall of the latch signal $\overline{\phi_S}$ it is amplified. At this moment, the object which is to be subjected to difference signal amplification by means of the transistors $Q_{10}$ and $Q_{20}$ forming a flip-flop is the nodes 100 and 200, and since the stray capacitances and resistances associated with these nodes 100 and 200 can be reduced to very small values as compared to those associated with the bit lines $D_1$ and $\overline{D_1}$, it becomes possible to achieve difference signal amplification at a high speed. Moreover, since neither of the MOS transistors $Q_{31}$ and $Q_{32}$ would be turned ON during the period of this amplification, it becomes possible to momentarily lower the potential at a node on the lower potential side (for instance, the node 200) to the $V_{SS}$ level, and hence the time when it becomes possible to read out information via the input/output buses DB and $\overline{DB}$ to an input/output terminal I/O can be made earlier. In other words, in the sense amplifier circuit according to the present invention, high-speed reading would become possible. The difference signal amplification can be achieved through a series of operations as described above, and during these operations, the potentials on the bit lines are held in the state where the minute difference signal is carried by the potentials, in other words the bit lines are waiting under the condition where refresh information at a higher level is completed.

That is, the bit lines are waiting under the condition where it is only necessary to subsequently refresh a bit line on a lower level side by means of a flip-flop.

Accordingly, if a write operation is not carried out subsequently, then refresh of a lower level on the bit line $D_1$ can be completed by raising the potential of the control signal $\overline{\phi_{SB}}$ so that among the transfer gate MOS transistors $Q_{31}$ and $Q_{32}$, only the transistor $Q_{32}$ on a lower potential side may be turned ON. To that end, it is only necessary to bring the potential of the control signal $\overline{\phi_{SB}}$ to about $V_{DD}-V_T$ ($V_T$: the threshold value of the transistors $Q_{31}$ and $Q_{32}$).

Figure 6:
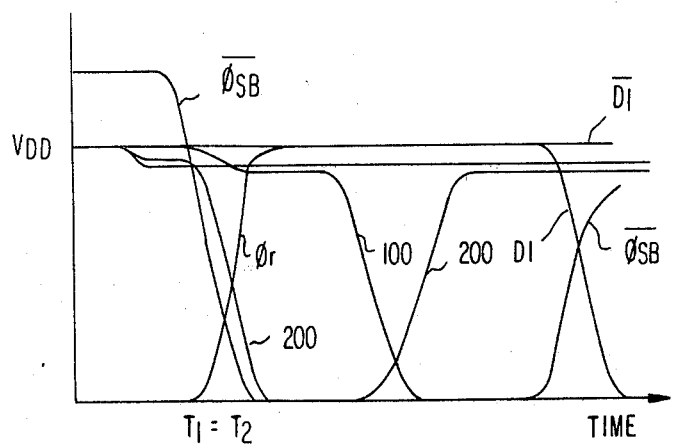

Now description will be made of the case where, in the sense amplifier circuit according to the present invention, after a read operation has been effected, opposite information is to be written. The voltage variations at the respective nodes in this case are illustrated in FIG. 6.

Upon writing, since the state of the flip-flop consisting of the transistors $Q_{10}$ and $Q_{20}$ has been already established in the proceding read operation, it is necessary to invert the state of the flip-flop according to write information applied from the input/output terminal I/O via the input/output circuit 50 to the data buses DB and $\overline{DB}$, and the object to be subjected to discharge and charge at this instance is only the nodes 100 and 200 because the transistors $Q_{31}$ and $Q_{32}$ are held OFF. Accordingly, the time required upon inversion of the flip-flop in the sense amplifier $SA_1$ can be made extremely small as compared with the time required for discharge and charge of the entire bit lines in the prior art. In other words, in the sense amplifier circuit according to the present invention, it becomes possible to write at a high speed.

Subsequently, after the flip-flop in the sense amplifier $SA_1$ has been inverted, as the refresh or rewrite of a higher level on a bit line was already done on the bit line $\overline{D_1}$ upon the read operation, writing of a lower level on the bit line $D_1$ is carried out by the flip-flop by raising the control signal $\overline{\phi_{SB}}$ up to an appropriate potential in a similar manner to the already described for refresh of a lower level. At this moment, in order to hold the level on the bit line $\overline{D_1}$ positioned on a higher level side, attention must be paid so that the transfer gate transistor $Q_{32}$ may not be turned ON, and the write level on the node 200 required for that purpose could be about [the potential of $\overline{\phi_{SB}}$] − [the threshold value of $Q_{32}$].

This means that the sense amplifier according to the present invention is not sensitive to the higher level of write information carried by the input/output data buses DB and $\overline{DB}$, and consequently, flexibility is increased in the limitations to the input/output circuit 50 serving as introduction means for write information to the input/output data buses, and to a higher level of the bit line selection signal $\phi_{r1}$. This indicates that the present invention brings about various merits such as ease in design of peripheral circuits, reduction of signals which are required to have a level equal to or higher than $V_{DD}$, enhancement of a reliability caused by the preceding merits, reduction of the number of elements to be used and of the area occupied by these elements, etc.

Accordingly, the memory device according to the present invention has a structure that is simple and is easily integrated at a high density. Moreover in the memory circuit, read and write at a high speed can be achieved easily, and it has additional characteristic merits, such as ease in design and reduction of the number and area of elements to be used, which are caused by a low degree of requirement of levels for the peripheral circuits. Therefore, it can be believed that the memory device according to the present invention comprises a novel circuit structure which has a bit merit as a constitutive element of a high density MOS dynamic memory. And the effectiveness of the sense amplifier circuit according to the present invention would become more remarkable as the stray capacitance and resistance of bit lines are increased with enlargement of a memory capacity.

Figure 7:
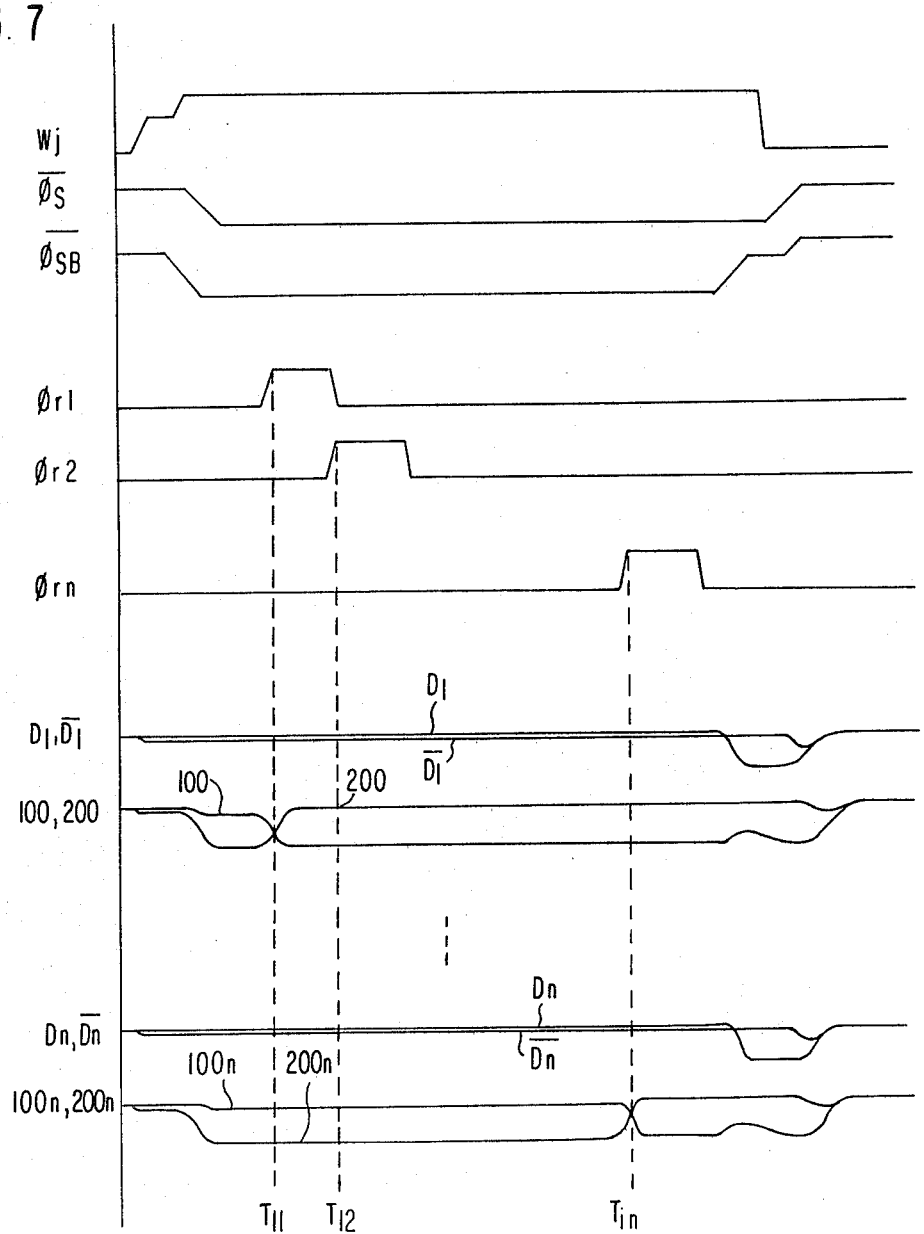
FIG. 7 is a waveform diagram showing operation waveforms in a serial access mode of operation.

Now, description will be made of a write operation in a serial access mode which can effectively derive the advantage of the present invention, with reference to FIG. 7. It is to be noted that the operation described in the following is based on the write operation explained previously with reference to FIG. 6. The so-called serial access mode means such mode of operation that a plurality of memory calls connected to a single energized word line are accessed successively.

At first, a word line $W_j$ is selected, and so it is raised in potential to a power supply level $V_{DD}$. Then, data stored in the memory cells $MC_1 \sim MC_n$ are applied to the digit lines $\overline{D_1} \sim \overline{D_n}$. Subsequently signals $\overline{\phi_S}$ and $\overline{\phi_{SB}}$ transfer to the ground level, then the respective sense amplifiers $SA_1 \sim SA_n$ carry out amplification operations, and thus an amplified difference signal is provided at the nodes 100 and 200. Then, at time $T_{11}$ a selection signal $\phi_{r1}$ is energized, so that the nodes 100 and 200 in the sense amplifier $SA_1$ are connected to the data buses DB and $\overline{DB}$ by the MOS transistors $Q_{41}$ and $Q_{42}$ respectively. Thus, write information is applied to the nodes 100 and 200 in the sense amplifier $SA_1$. Subsequently, at time $T_{12}$ the selection signal $\phi_{r1}$ is denergized and instead a selection signal $\phi_{r2}$ is energized, so that write information is also applied to the sense amplifier $SA_2$ via the data buses DB and $\overline{DB}$ in a similar manner. Such operations are successively repeated in the respective sense amplifiers, and eventually at time $T_{1n}$, a write operation is carried out in the sense amplifier $SA_n$. After the write information has been applied to the sense amplifier $SA_n$ at time $T_{1n}$, a digit line $D_n$ connected to the node 100 in the sense amplifier $SA_n$ is discharged, and then a series of write operations have been transmitted. In this instance, discharge of the digit lines connected to the sense amplifiers $SA_1 \sim SA_{n-1}$ is not seen externally. Therefore, high-speed consecutive access becomes possible. For instance, if one makes an investigation of consecutive access times in the case of n=8, the write time for each sense amplifier is equal to the sum of the discharge time of the node 100 (or 200) and the charge time of the node 200 (or 100). In the proposed type of sense amplifier, the discharge time of the node 100 or 200 is 6 nSec, the charge time of the same is 7 nsec and the discharge time of the bit line is 10 nsec, so that the time required for serial access to 8 bits is calculated as follows:

(6 nsec+7 nsec)×8+10 nsec=114 nsec.

Whereas, in the case of executing similar access in the memory device in the prior art, it is necessary to effect discharge and charge of a bit line upon each access to each bit. Generally it takes 20 nsec for charge of a bit line and 10 nsec for discharge of a bit line, and so, the time required for serial access to 8 bits is calculated as follows:

$$(20 \text{ nsec} + 10 \text{ nsec}) \times 8 = 240 \text{ nsec}.$$

As described above, according to the present invention, a great reduction of the access time can be achieved.

Figure 8:
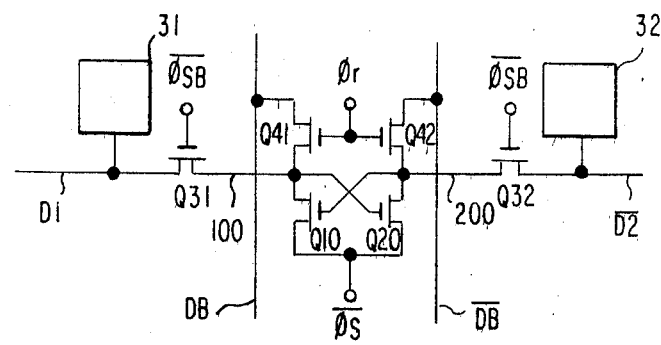
FIG. 8 is a schematic circuit diagram showing another preferred embodiment of a memory device according to the present invention.

Another preferred embodiment of the present invention is illustrated in FIG. 8. In this modified embodiment, pull-up circuits 31 and 32 are added to the respective bit lines $D_1$ and $\overline{D_1}$ of the sense amplifier circuit $SA_1$ shown in FIG. 4.

It is possible to make this pull-up circuit achieve the role of presenting a higher level on a bit line upon a refresh of a lower level and transfer gate transistors $Q_{31}$ and $Q_{32}$ are kept ON when a minute difference signal is carried on the bit lines in order to hold a higher level upon read and write operations at a perfect $V_{DD}$ level.

For this pull-up circuit, various types of circuits are already knows, and regardless of the circuit employed, always a similar effect can be achieved, provided that the circuit is of such type that the circuit does not become a current load upon a refresh of a lower level and transfer gate transistors $Q_{31}$ and $Q_{32}$ are kept ON when a minute difference signal is carried on the bit lines. Furthermore, since addition of such pull-up circuits 31 and 32 has no influence upon the nodes 100 and 200, the modified sense amplifier circuit can achieve high-speed read as well as high-speed write quite similarly to the sense amplifier illustrated in FIG. 4.

In addition, it is possible to modify the operation by combining the operation of these pull-up circuits and the voltage variations of the signal $\phi_{SB}$ in such manner that a bit on a lower potential side is refreshed fter the read operation to enable the subsequent write operation.

Figure 9:
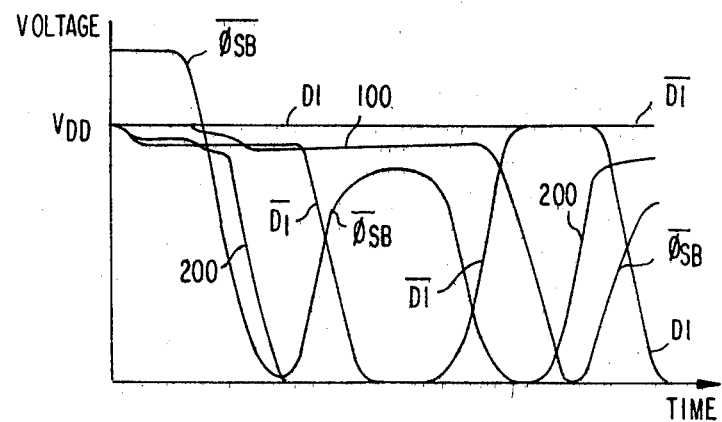
FIG. 9 is a waveform diagram showing one example of internal waveforms upon operation of the circuit shown in FIG. 8.

This mode of operation is illustrated in FIG. 9. After a read operation, the potential of the signal $\overline{\phi_{SB}}$ is raised to achieve refresh of a bit line on a lower level side. Thereafter when write is effected, the signal $\overline{\phi_{SB}}$ is again brought to the $V_{SS}$ level, and at the same time both bit lines are brought to the $V_{DD}$ level by actuating the pull-up circuits 31 and 32. And after the state of the flip-flop consisting of the transistors $Q_{10}$ and $Q_{20}$ has been established by a write operation, the potential of the signal $\overline{\phi_{SB}}$ is raised again to bring a bit line on a lower level side to the $V_{SS}$ level. In this method also, the requirement for a write level is still not severe, and so, the merit of the present invention of ease in design of a peripheral circuit would not be lost.

I claim:

1. A semiconductor memory device comprising first and second bit lines, a sense amplifier having a first input terminal and a second input terminal, a plurality of memory cells, address means for addressing the memory cells thereby causing a potential difference between said first and second bit lines, a first data line, a second data line, a write circuit coupled to said first and second data lines for operatively supplying said first and second data lines with a pair of true and complementary write signals when a write operation is conducted, a first control gate coupled between said first input terminal and said first bit line, a second control gate coupled between said second input terminal and said second bit line, said first bit line and said first input terminal being coupled only by said first control gate, said second bit line and said second input terminal being coupled only by said second control gate, a first selection gate coupled between said first input terminal and said first data line, a second selection gate coupled between said second input terminal and said second data line, means for selectively conducting said first and second selection gates to thereby apply said pair of write signals to said first and second input terminals, means for determining a state of said sense amplifier in accordance with said pair of write signals applied through said first and second selection gates, means for operatively opening said first and second selection gates from a first time point in said write operation, means for operatively closing said first and second control gates at least from said first point to a second time point when the logic state of said sense amplifier is determined in accordance with said write signal, and means for opening said first and second control gates after said second time point, wherein said write signals are applied to said first and second input terminals when said first and second input terminals are isolated from said first and second bit lines by the closed first and second control gates.

2. The memory device according to claim 1, in which said first and second control gates are composed of insulated gate field effect transistors.

3. The memory device according to claim 1, in which said sense amplifier includes a first insulated gate field effect transistor having a gate connected to said second input terminal, and a second insulated gate field effect transistor having a gate connected to said first input terminal.

4. A memory circuit comprising a plurality of memory cells arrayed in rows and columns; a sense amplifier for each column; first and second bit lines for each sense amplifier, the memory cells in each column being connected to one of the respective bit lines when the respective memory cells are enabled by a row selection signal; row enable means for each row for enabling the memory cells in the respective rows to transfer data stored therein to the bit lines for the respective columns, each sense amplifier having first and second input nodes each having a relatively small capacitance value as compared with the capacitance value of the respective first and second bit lines, each amplifier including a first transistor connecting the first input node to a latch node and a second transistor connecting the second input node to the latch node, the gate of the first transistor being part of the second input node and the gate of the second transistor being part of the first input node;

first transfer means coupled between the first bit line and the first input node, and second transfer means coupled between the second bit line and the second input node, said first bit line and said first input node being coupled only by said first transfer means, said second bit line and said second input node being coupled only by said second transfer means; control means for operatively discharging a charge on the latch node thereby to determine states of said first and second input nodes after the generation of said row selection signal; bit line precharge means for precharging the bit lines such that substantially the same precharge voltage level is on both said first and second bit lines;

first and second input/output bus lines for carrying readout data during a read operation and write data during a write operation; a first selection gate means for connecting the first input/output bus line to the first input node; a second selection gate means for connecting the second input/output bus line to the second input node; and control means for controlling impedance of the first and second transfer means; wherein the impedances of the first and second transfer means are made small in value during a period from the occurrence of said row selection signal to a commencement of the discharge by said control means and are made large in value during a period from the commencement of the discharge by said control means to the determination of the states of the first and second input nodes, and made small in value after the determination of the states of the first and second input nodes.

5. The circuit according to claim 4, further comprising an input/output circuit coupled to said first and second input/output bus lines for selectively supplying them with write data during a write operation.

6. The circuit according to claim 5, further comprising means for selectively enabling the first and second selection means after one of the bit lines is discharged during a read operation.

7. The circuit according to claim 4, wherein each of said first and second transfer means includes an insulated gate field effect transistor.

8. A semiconductor memory device comprising a bit line, a plurality of word lines intersecting with said bit line, a plurality of memory cells disposed at the intersections of said bit line and said word lines, a sense amplifier having an input terminal, a first field effect transistor coupled between said bit line and said input terminal of said sense amplifier, a data line, a second field effect transistor coupled between said data line and said input terminal of said sense amplifier, an input circuit coupled to said data line for selectively supplying said data line with a write signal, first means for selectively making said second transistor conducting when said bit line is selected, second means for operatively enabling said sense amplifier thereby to determine a logic level of said input terminal, third means for making said first transistor nonconducting during a predetermined period of time from a time point when said second transistor is made conducting to thereby isolate said bit line from said input terminal, and means for making said first transistor conducting after said predetermined period has elapsed, said predetermined period allowing said sense amplifier to determine its logic state by said write signal.

9. The memory device according to claim 8, in which said sense amplifier is of a flip-flop type.

10. In a dynamic random access memory having a plurality of memory cells arrayed in rows and columns with first and second bit lines for each column, the cells of each column being connectable to the respective first and second bit lines when each respective row of memory cells is enabled, the first and second bit lines being connected to first and second input terminals of a sense amplifier through first and second transfer gates respectively, the method of writing to a selected memory cell comprising:

increasing the impedance of said first and second transfer gates to thereby isolate said first and second input terminals from said first and second bit lines;

applying a pair of true and complementary input signals to the first and second input terminals of said sense amplifier during the impedance-increased state of said first and second transfer gates without applying said input signals to said first and second bit lines;

determining the logic states of said first and second input terminals by said input signals; and decreasing the impedance of said first and second transfer gates thereby to transmit the determined logic states of said first and second input terminals to said first and second bit lines.

* * * * *

UNITED STATES PATENT AND TRADEMARK OFFICE
CERTIFICATE OF CORRECTION

PATENT NO. : 4,451,906　　　　　　　　　Page 1 of 3
DATED　　　 : May 29, 1984
INVENTOR(S) : H. IKEDA It is certified that error appears in the above-identified patent and that said Letters Patent is hereby corrected as shown below:

Abstract, line 7, after "without" insert --coupling--;

Column 1, line 18, "a" delete "an";

line 61, delete "modes" and insert therefor --nodes--;

Column 2, line 20, delete "operates" and insert therefor --operate--;

line 29, after "lines" insert -- , --;

line 32, after "all" insert -- , --;

Column 3, line 3, delete "to", first occurrence, and insert therefor --with--;

line 45, delete "At" and insert therefor --A--;

line 48, delete "asa" and insert therefor -- as a--;

line 57, delete "$D_1$", second occurrence, and insert therefor --$\bar{D}_1$--' line 60, delete "$D_1$", second occurrence, and insert therefor --$\bar{D}_1$--;

UNITED STATES PATENT AND TRADEMARK OFFICE
CERTIFICATE OF CORRECTION

PATENT NO. : 4,451,906

DATED : May 29, 1984

INVENTOR(S) : H. IKEDA

It is certified that error appears in the above-identified patent and that said Letters Patent is hereby corrected as shown below:

Column 4, line 56, delete "$D_1$", second occurrence, and insert therefor --$\bar{D}_1$--;

Column 5, line 4, after "that" insert -- , --;

line 58, delete "transistor and insert therefor --transfer--;

Column 6, line 12, after "Input/output" delete "or read/write control";

line 12, delete "DB" second occurrence, and insert therefor --$\overline{DB}$--;

line 13, before "circuit" insert --or read/write control--;

line 18, delete "DB" and insert therefor --$\overline{DB}$--;

Column 7, line 11, delete "$D_1$" and insert therefor --$\bar{D}_1$--;

line 26, delete "proceding and insert therefor --proceeding--;

UNITED STATES PATENT AND TRADEMARK OFFICE
CERTIFICATE OF CORRECTION

PATENT NO. : 4,451,906
DATED : May 29, 1984
INVENTOR(S) : H. IKEDA

It is certified that error appears in the above-identified patent and that said Letters Patent is hereby corrected as shown below:

Column 7, line 57, after "50" insert -- , --;

Column 8, line 9, delete "bit" and insert therefor --big--;

line 38, delete "denergized" and insert therefor --deenergized--;

Column 9, line 7, before "great" delete "a";

line 21, delete "knows" and insert therefor --known--;

line 34, delete "$\emptyset SB$" and insert therefor --$\overline{\emptyset SB}$--;

line 35, delete "fter" and insert therefor --after--.

Signed and Sealed this

Twenty-second Day of January 1985

[SEAL]

Attest:

DONALD J. QUIGG

Attesting Officer  Acting Commissioner of Patents and Trademarks